United States Patent [19]

Minks

[11] Patent Number: 4,480,243

[45] Date of Patent: Oct. 30, 1984

[54] ELECTROMAGNETIC RELAY

[75] Inventor: Werner Minks, Kleingeschaidt, Fed. Rep. of Germany

[73] Assignee: International Standard Electrik Corporation, New York, N.Y.

[21] Appl. No.: 398,470

[22] Filed: Jul. 15, 1982

[30] Foreign Application Priority Data

Aug. 5, 1981 [DE] Fed. Rep. of Germany ....... 3131019

[51] Int. Cl.[3] ........................ H01H 45/04; H05K 5/06

[52] U.S. Cl. ................................ 335/202; 174/52 PE; 174/52 S

[58] Field of Search .......... 335/202; 174/52 S, 52 PE

[56] References Cited

U.S. PATENT DOCUMENTS

| | | | |
|---|---|---|---|
| 3,570,119 | 3/1971 | Baker | 174/52 PE |
| 3,838,316 | 9/1974 | Brown et al. | 174/52 PE |
| 4,185,163 | 1/1980 | Schedele | 174/52 S |
| 4,246,437 | 1/1981 | Frey et al. | 174/52 S |
| 4,349,693 | 9/1982 | Hinrichs | 174/52 PE |
| 4,369,330 | 1/1983 | Pilz | 174/52 S |

FOREIGN PATENT DOCUMENTS 8020770 1/1980 Fed. Rep. of Germany .

*Primary Examiner*—E. A. Goldberg
*Assistant Examiner*—George Andrews
*Attorney, Agent, or Firm*—T. E. Kristofferson; T. L. Peterson

[57] ABSTRACT

Electromagnetic relay with a housing consisting of two parts (1, 2) which are bonded to one another, with a circumferential groove (5) being provided for in one bottom part (1), which is filled with an adhesive (6) in which the cap-shaped housing member (2) immerses after having been placed into position. The groove (5) is arranged within the area in which the electric terminals (3) are led through the bottom part (1), so that simultaneously, the adhesive (6) also effects a sealing of the lead-through points (4) of the terminals (3).

3 Claims, 1 Drawing Figure

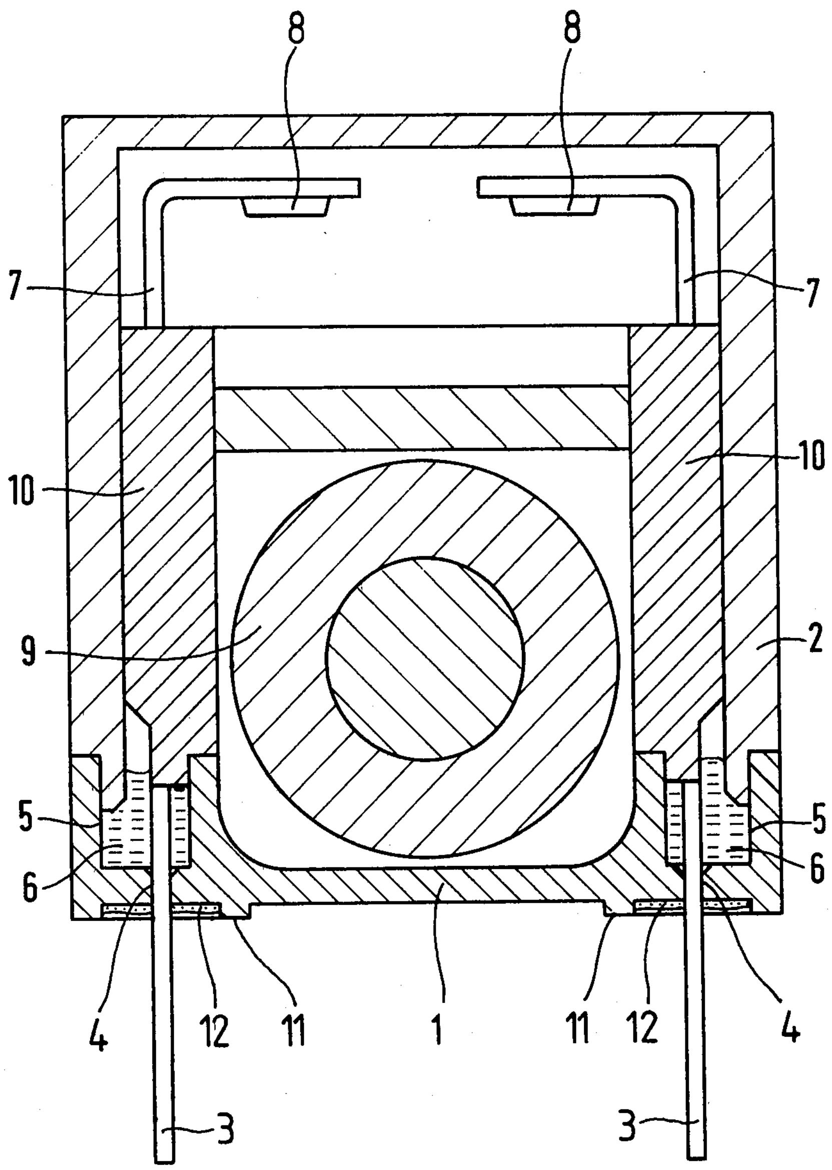
8
8
7
7
10
10
9
2
5
5
6
6
4
12
11
1
11
12
4
3
3

ELECTROMAGNETIC RELAY

BACKGROUND OF THE INVENTION

The invention relates to an electromagnetic relay comprising a divided housing consisting essentially of a flat part and of a cap-shaped part which are bonded to one another in such a way that a circumferential groove on the inside of the one part is filled with an adhesive in which the rim portion of the respective other part immerses.

Electromagnetic relays, in particular such ones which are intended to be soldered on to printed circuit boards, are required to have a completely tight relay housing, i.e., a housing which is at least wash-tight, preventing soldering vapours from entering into the interior of the relay housing while soldering the terminals of the relay to the printed circuit board, as well as for preventing liquids from entering into the relay housing during the subsequent cleaning of the printed circuit board by using various washing liquids.

Housings of electromagnetic relays chiefly have leakages at two points, i.e., at the points where the two parts of the housing are connected and at the points where the terminals are led through the housing.

For sealing the lead-through points of the electric terminals it is already known from DE-OS No. 2,129,918 to seal the relay housing at the lead-through point with a foil through which the electric terminals project. In particular, there is suggested to use a foil of thermoplastic material which, by the effects of heat, is supposed to be bonded to the terminal pins. This foil may also be of trough-shaped design in order to simultaneously protect the connecting points between the individual parts of the housing.

Such a measure is not only expensive and circumstantial, but also unsuitable for obtaining a wash tight sealing of the relay.

Likewise expensive is the measure as disclosed in DE-AS No. 2 616 299, i.e., of depositing a covering layer of a material having a high capillary absorptive capacity, on to the housing especially at the points where the terminals are led through, and to saturate this material with a highly fluid sealing compound.

Finally, from DE-OS No. 2 851 329 it is known to seal the lead through points of the terminals in the bottom of a relay by a synthetic resin compound deposited from the outside. This conventional measure is likely to cause elevations on the bottom of the relay, owing to the sealing compound, preventing the relay from being correctly placed on to a printed circuit board. Moreover, there is still required an additional sealing of the individual parts of the housing.

From DE-OS No. 2 622 133 it is still known to effect the sealing of the interlockingly engaging parts of the housing of an electromagnetic relay in such a way that a sealing compound is inserted between the interlocking parts of the housing. This is intended to create a large sealing surface between the parts of the housing. This, however, not only requires housing parts which fit exactly on to each other, but also the insertion of the sealing compound during the assembly is circumstantial and rather time consuming. Moreover, the large joining surfaces also require greater amounts of sealing compound.

In this conventional type of embodiment it is also possible to lead the electric terminals between the two parts of the housing, towards the outside. This not only requires a complicated form of terminals, but also requires a still larger amount of sealing means between the two parts of the housing, because these, owing to the terminals led therethrough, are compulsorily also held at a relatively large spacing.

Finally, from DE-GM No. 8 020 770 there is known a housing for an electromagnetic relay which consists of a trough-shaped base and of a cover placed thereon. The cover is provided with a circumferential groove which is filled with a suitable adhesive in which the rim portion of the trough-shaped housing member is immersed. In this way there is achieved a simple bonding between the parts of the housing. The electric terminals of the relay are led through the bottom part of the trough-shaped housing member and, therefore, must be provided with a separate sealing.

The invention is based on the prior art according to DE-GM No. 8 020 770.

It is the object of the invention to achieve in a simple way and with a small amount of sealing material, a simultaneous sealing of the housing members with respect to one another and of the points at which the terminals are led through the housing.

SUMMARY OF THE INVENTION

According to the invention there is provided an electromagnetic relay comprising a housing including a substantially flat bottom part and an inverted cap-shaped upper part. An adhesive is provided in a circumferential groove formed in the upper side of the bottom part. The cap-shaped upper part has side walls, the lower ends of which are immersed in the adhesive. Apertures are provided in the bottom part opening into said groove. Electrical terminals in the housing pass downwardly through the adhesive in the groove into said apertures. The adhesive both seals the cap-shaped upper part to said bottom part and seals the terminals to the bottom part of the housing.

BRIEF DESCRIPTION OF THE DRAWING

The drawing shows the electromagnetic relay of the invention, in transverse cross-section.

DESCRIPTION OF THE PREFERRED EMBODIMENT

The housing of the electromagnetic relay according to the invention consists of a bottom part 1 and of a cap-shaped part 2. The bottom part 1 is provided on its inside with a circumferential groove 5 in which, upon assembling the parts of the housing, the rim portion of the cap-shaped housing member 2 immerses. This groove is filled with an adhesive 6 effecting a sealing of the two housing members with respect to one another. According to the invention, electric terminals 3 of the relay are led through the bottom part 1 at point 4 within the area of the groove 5. In this way, the adhesive 6 simultaneously effects a sealing of the housing members 1 and 2 with respect to one another, as well as of the lead-through points 3 with respect to the bottom part 1. Since merely the groove 5 has to be filled with an adhesive, there results a simple assembly and only a small amount of adhesive is required. As an adhesive it is possible to use any material which is capable of being brought into a liquid state. Preferably, a cold setting plastics material is used as the adhesive.

The invention applies advantageously to electromagnetic relays comprising contact strips formed into the wall of the housing, with these contact strips projecting on the bottom side of the housing as plug-in terminals and, on the top side, are connected to the relay contacts or coil leads.

According to the further embodiment of the invention, a housing jacket 10 is mounted in the relay housing inside the cap-shaped part 2. Contact strips 7 are moulded in the side walls of the jacket. The lower rim portion of the jacket 10 is immersed in the adhesive 6 in the groove 5. The moulded contact strips 7, for example, are provided on their upper parts with relay contacts 8 and, on their lower parts, are designed as plug-in terminals 3. Inside the housing jacket 10 there is arranged the magnet system of the relay which, in the drawing, is denoted by the coil with the core indicated by the reference numeral 9.

For assembling the relay, the housing jacket 10 is slipped on to the bottom part 1, with the terminals 3 being led through corresponding lead-through openings 4 in the bottom part 1. After both the magnet and the contact system have been assembled, a setting adhesive 6 is filled into the groove 5, whereupon the cap-shaped housing member 2 is placed into position. In this way there is effected on one hand, a sealing of the terminals 3 at the lead-through point 4 in the bottom part 1 and, on the other hand, the housing jacket 10 is tightly connected to the bottom part 1, and also the cap-shaped housing member 2 is tightly sealed with respect to the bottom part 1 of the housing. This results in an excellent sealing of the relay with respect to soldering vapours and washing liquids, with this being effected in a very simple way and by involving only a small amount of sealing material.

Moreover, it has proved that the adhesive 6, as entering into the lead-through point 4, often spreads in the form of a thin layer over the bottom side of the bottom part 1. In order to reliably prevent the adhesive from spreading in the aforementioned way, it is suitable for the bottom part 1, to be provided on its underside with annular elevations 11 extending around the lead-through points 4, which prevent the adhesive layer 12 from spreading. Considering that, for this purpose, elevations of a few tenths of millimeters are sufficient, this results in no noticeable enlargement of the overall height. Mostly small spacing legs are anyway moulded to the bottom part in order to prevent the relay from being directly placed on to the pc board. In that case, the rings 11, which may either by of an annular but also polygonal shape, do not at all affect the overall height of the relay.

I claim:

1. An electromagnetic relay comprising:
- a housing including a substantial flat bottom part and an inverted cap-shaped upper part;
- a circumferential groove in the upper side of said bottom part;
- an adhesive in said groove;
- said cap-shaped upper part having side walls providing a circumferential enclosure, the lower ends of all of said side walls being located in said groove so as to be immersed in said adhesive;
- apertures in said bottom part opening into said groove; and
- electrical terminals in said housing passing downwardly through the adhesive in said groove into said apertures whereby said adhesive seals both said cap-shaped upper part to said bottom part and seals said terminals to said bottom part.

2. An electromagnetic relay as set forth in claim 1 wherein:
- said housing also includes a hollow housing jacket within said cap-shaped upper part, said jacket having side walls;
- said terminals are mounted in said jacket side walls; and
- the lower ends of said jacket side walls are immersed in said adhesive.

3. An electromagnetic relay as set forth in claim 2 wherein:
- said bottom part of said housing embodies spaced circumferential inner and outer ridges forming therebetween said groove;
- a downwardly facing shoulder on the outside of said cap-shaped part above said lower end of the side walls thereof resting on said outer ridge; and
- a downwardly facing shoulder on the inside of said housing jacket above said lower ends of said jacket side walls resting on top of said inner ridge, said housing jacket nesting within said cap-shaped part.

* * * * *

UNITED STATES PATENT OFFICE

CERTIFICATE OF CORRECTION

PATENT NO. : 4,480,243

DATED : October 30, 1984

INVENTOR(S) : Werner Minks

It is certified that error appears in the above-identified patent and that said Letters Patent are hereby corrected as shown below:

Title Page, Item[73] should read as follows:

--International Standard Electric Corporation, New York, N.Y.--

Signed and Sealed this

*Sixteenth* Day of *April 1985*

[SEAL]

*Attest:*

DONALD J. QUIGG

*Attesting Officer* *Acting Commissioner of Patents and Trademarks*